United States Patent [19]

Lish

[11] Patent Number: 4,538,113
[45] Date of Patent: Aug. 27, 1985

[54] SWITCHED CAPACITOR FILTER

[75] Inventor: Charles A. Lish, Coram, N.Y.

[73] Assignee: Standard Microsystems Corporation, Hauppauge, N.Y.

[21] Appl. No.: 597,264

[22] Filed: Apr. 6, 1984

[51] Int. Cl.³ .............................................. H03F 3/68
[52] U.S. Cl. ..................................... 330/126; 330/51; 330/84
[58] Field of Search .................. 330/51, 84, 107, 109, 330/126; 328/167

[56] References Cited

U.S. PATENT DOCUMENTS 3,769,604  10/1973  Atkinson .......................... 330/126 X
4,117,413  9/1978   Moog ................................. 330/51 X Primary Examiner—James B. Mullins
Assistant Examiner—Steven J. Mottola
Attorney, Agent, or Firm—Hopgood, Calimafde, Kalil, Blaustein & Judlowe

[57] ABSTRACT

A band-pass filter includes an arrangement of individual filter sections and means for weighting and summing the band-pass functions of the filter sections such that the active conjugate pole pairs are arranged in the z plane on a circle concentric to the unit circle and spaced by equal angles with the exception of corrector poles, which are spaced by half-angle increments from the adjacent poles. In the embodiment of the invention described, the filter sections are in the form of digitally controlled switched capacitor filters.

6 Claims, 3 Drawing Figures

SWITCHED CAPACITOR FILTER

The present invention relates generally to filters, and more specifically to an improved band-pass filter having linear phase characteristics and steep skirts at the pass-band stop-band boundaries.

Band-pass filters are in widespread use in many applications such as in modems and other components employed in high-performance data communication equipment. In these applications it is often necessary for the filter to achieve linear phase in the pass band, so as to minimize distortion, and sharp cut-off skirts in the stop or nontransmission band. In the March 1964, Proceeding of the IEEE, Robert M. Lerner, in an article entitled "Band Pass Filters with Linear Phase", described in theoretical terms a filter having such desirable characteristics, which employed passive LC resonators and combining circuits. Although the filter described by Lerner was theoretically effective it could not be practically implemented in an actual filter because of the limitations inherent in the use of real inductors and capacitors.

As a result, for several years following the publication of the Lerner article, there was little activity or interest in employing the Lerner filter-design technique in the design of an actual filter, and it was generally deemed unfeasible to design and fabricate a band-pass filter which provided nearly rectangular amplitude response along with linear phase response. That situation continued until the 1970s at which time there was a renewed interest in the Lerner technique, as exemplified by U.S. Pat. No. 3,727,147 to DeWitt and an article by Delagrange, entitled "Bring Lerner Filters Up-To-Date: Replace Passive Components With Op-Amps" that appeared in the Feb. 15, 1979 edition of Electronic Design.

These two publications proposed practical implementations of the Lerner filter design technique through the use of active filter sections. Although the filter designs proposed in these publications are more capable of practical implementation as compared to the Lerner design, they are not readily amenable to fabrication in an MOS integrated circuit. Since a significant number of modern data-communication systems are fabricated as integrated circuits, the lack of a filter of the type described in theoretical terms by Lerner that could be readily fabricated as an integrated circuit has thus far significantly limited the use of the Lerner concept to design band-pass filters for use in practical commercial applications.

In recent years, a switched capacitor filter, which can be implemented in the form of an MOS integrated circuit, has been developed, as disclosed in U.S. Pat. No. 4,315,227. However, to achieve linear phase response with a filter composed of a plurality of switched capacitor filters, it has heretofore been deemed necessary to arrange a plurality of switched capacitor filter sections in cascade. This has, however, had the detrimental effect of increasing the number of filter sections required at a corresponding increase in cost and integrated circuit chip area, as well as an increase in the settling time of the filter in some cases.

It is accordingly an object of the present invention to provide an improved band-pass filter having steep skirts and linear phase response.

It is a further object of the invention to provide an improved filter of the type described, which can be readily implemented or fabricated as an integrated circuit.

It is another object of the present invention to provide an improved band-pass filter of the type described employing switched capacitor filter sections.

To these ends, the present invention provides a filter which comprises an arrangement of filter sections and means for weighting and summing the band-pass functions of these sections by means of which the active conjugate pole pairs of the filter sections are arranged in the z plane on a circle concentric to the unit circle and spaced by equal angles with the exception of the corrector poles, which are spaced by a half-angle increment from the adjacent pole. In the embodiment of the invention described hereinbelow, the filter sections are in the form of digitally controlled switched capacitor filters having predetermined band-pass functions to achieve the desired active conjugate poles.

To the accomplishment of the above and such further objects as may hereinafter appear, the present invention relates to a filter substantially as defined in the appended claims and as described in the following specification as considered with the following drawings in which:

As explained in greater detail in the aforementioned Lerner and Delagrange papers, the transfer function of a filter in the "s" plane may be described in terms of a pole-residue summation rather than in terms of the more conventional pole-zero cascaded representation. In a pole-residue summation the frequency response characteristic of the filter is expressed as a summation of fractions in which the numerators represent the constants or residues and the denominators represent the variables as functions of frequency and thus define the locations of the poles. A Lerner "s" plane pole-residue summation can be rewritten in the "z" plane as follows:

$$(1)\ H(z) = \frac{1 - e^{-b\tau}z^{-1}}{1 - z^{-1}} 2\left[\sum_{k=n_L}^{n_h}\left(\frac{b(-1)^k(1 - z^{-1})}{(1 - e^{-b\tau}e^{j2k a\tau}z^{-1})(1 - e^{-b\tau}e^{-j2k a\tau}z^{-1})}\right)\right] \pm$$

main bandpass
'pole residue generators'

$$\frac{b/2(1 - z^{-1})}{(1 - e^{-b\tau_e j(2nh+1)a\tau_z-1})(1 - e^{-b\tau_e -j(2nh+1)a\tau_z-1})} \pm \frac{b/2(1 - z^{-1})}{(1 - e^{-b\tau_e j(2nL-1)a\tau_z-1})(1 - e^{-b\tau_e j(2nL-1)a\tau_z-1})}$$

corrector bandpass
'pole residue generators'

Figure 3:
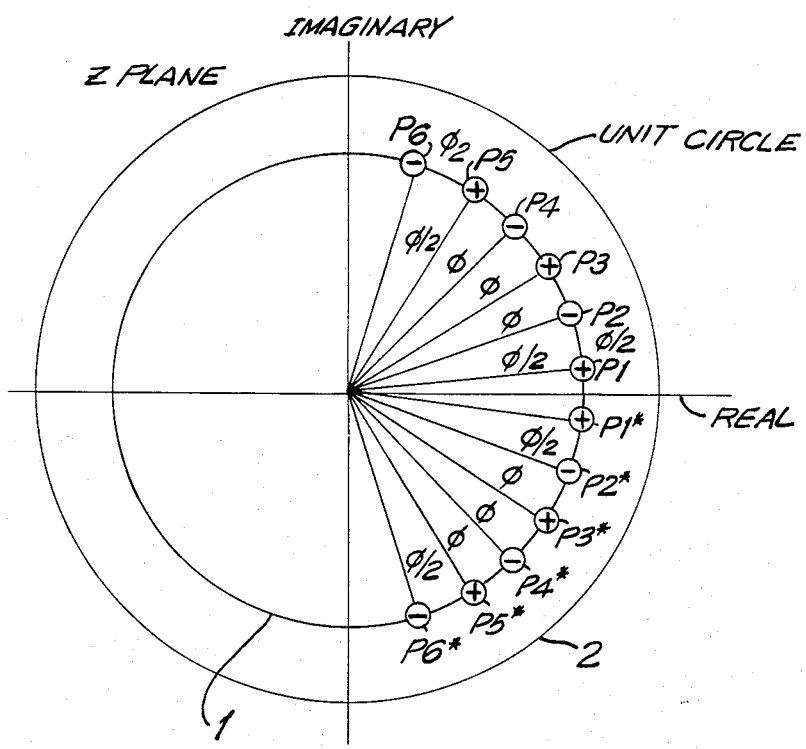
FIG. 3 is a graphical representation in the z plane of the filter illustrated schematically in FIG. 1.

Equation (1) consists of a summation of band-pass functions weighted by alternating polarity coefficients. The first-order multiplier of Equation (1) can be ignored when it is well out of the pass band of the filter. Thus, in the filter of the invention, as described in greater detail below, the arrangement of the individual filter sections and the means for combining the output functions of those filter sections results in a filter for which the "z" plane transform function is one in which the active poles are arranged on a circle 1 which is concentric to the unit z circle 2, which corresponds to the jw—axis in the "s" plane. The circle 1 has a radius less than that of the unit circle 2. FIG. 3 shows the pole arrangement for the conjugate poles P1-P6 and P1*-P6* for a six-section filter implemented according to one embodiment of the invention, as illustrated schematically in FIG. 1. As also shown in FIG. 3, the main poles P2, P3, P4 and P5 (as well as their conjugates) are equiangularly spaced from one another by an angle $\phi$, and the corrector poles P1 and P6 are spaced from the adjacent poles by an angle $\phi/2$.

Figure 1:
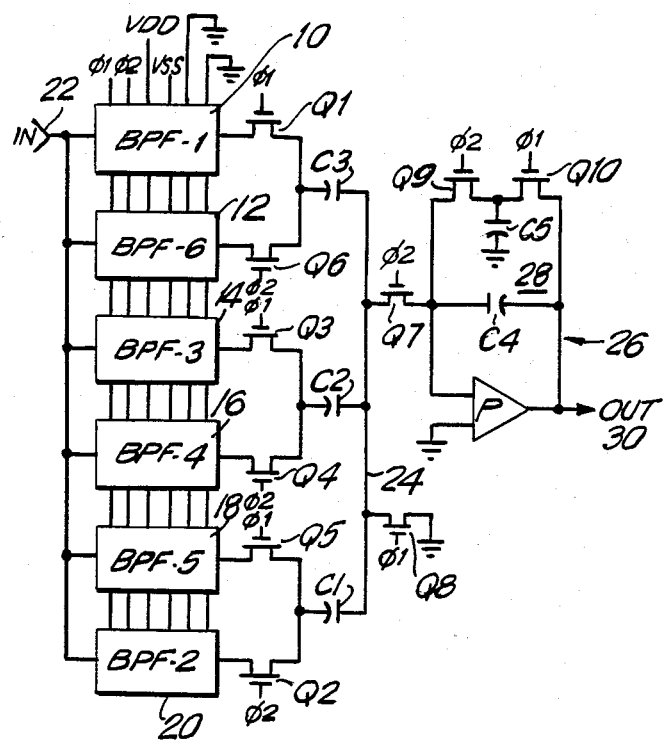
FIG. 1 is a schematic block diagram of a filter arrangement in accordance with the present invention.

The embodiment of the filter illustrated in FIG. 1 includes a plurality, here six, of band-pass filter sections BPF designated 10 to 20 in FIG. 1. Each filter section contributes a pair of conjugate poles to the overall filter transform function shown in the z plane in FIG. 3. Thus, filter section 10 contributes conjugate poles P1 and P1*, filter section 20 contributes conjugate poles P2 and P2*, filter section 14 contributes conjugate poles P3, P3*, and so on. It will be understood that a greater or lesser number of filter sections and a correspondingly greater or lesser number of conjugate pole pairs can be provided, and that the six-section filter of FIG. 1 is illustrated as an example of the invention and is not to be considered as limiting the invention to any number of filter sections.

Figure 2:
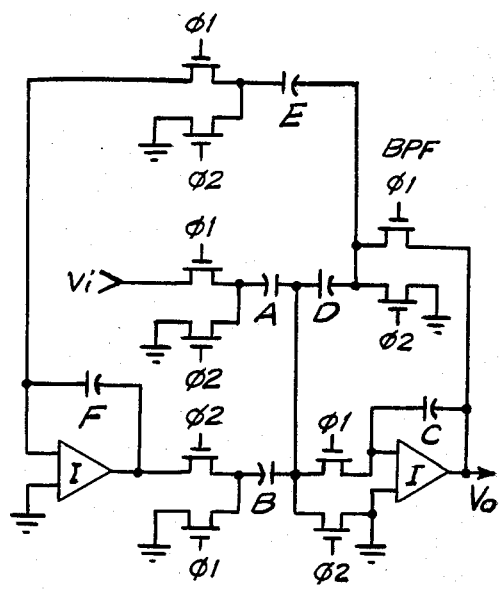
FIG. 2 is a schematic diagram of a switched capacitor filter section that may be used in the filter of FIG. 1.

Each of the filter sections BPF is substantially identical in configuration and is preferably in the form of a digitally switched capacitor filter as illustrated in FIG. 2. As illustrated in FIG. 1, the inputs of each of the filter sections are connected in common to an input terminal 22. Each of the filter sections also receives timing or clock signals $\phi 1$ and $\phi 2$, which are mutually of opposite phase or polarity; that is, when clock signal $\phi 1$ is high, clock signal $\phi 2$ is low, and vice versa. Each of the filter sections also receives supply voltages Vss and Vdd and a pair of ground lines.

The outputs of selected pairs of filter sections are connected to a weighted summing capacitor through pairs of MOS switching transistors, which are alternatively rendered conductive and nonconductive by clock signals $\phi 1$ and $\phi 2$ respectively applied to their gates. Thus, as shown in FIG. 1, the outputs of filter sections 20 and 18 are respectively applied to the source-drain circuits of MOS field-effect transistor (FETs) Q2 and Q5, which, in turn, have the $\phi 2$ and $\phi 1$ clock signals respectively applied to their gates. Similarly, the outputs of filter sections 16 and 14 are connected to the source-drain circuits of FETs Q4 and Q3, which have the $\phi 2$ and $\phi 1$ clock signals respectively applied to their gates; and the outputs of filter sections 12 and 10 are connected respectively to the source-drain circuits of FETs Q6 and Q1, which, in turn, respectively receive the $\phi 2$ and $\phi 1$ clock signals at their gates.

The outputs of FETs Q2 and Q5 are applied to one terminal of a capacitor C1, and the outputs of FETs Q4 and Q3 are applied to one terminal of capacitor C2, which has the same value of capacitance as capacitor C1. The outputs of FETs Q6 and Q1 are connected to a capacitor C3, which has a value of capacitance one-half that of capacitors C1 and C2.

The other terminals of capacitors C1, and C2, and C3 are connected in common to a summing line 24, which is connected to the source-drain circuit of FETs Q7 and Q8, which respectively have the $\phi 2$ and $\phi 1$ clock signals applied to their gates. The output of FET Q8 is connected to ground whereas the output of FET Q7 is connected to an output circuit 26, which comprises an operational amplifier P and a sample-and-hold circuit 28. The latter includes a capacitor C4 connected across the input and one output of amplifier P, and a pair of FETs Q9 and Q10 which have the $\phi 2$ and $\phi 1$ clock signals respectively applied to their gates. The outputs of FETs Q9 and Q10 are connected in common to one terminal of a capacitor C5, the other terminal of which is connected to ground as is the other input of amplifier P. The output of amplifier P at 30 is the output of the filter.

As noted, each of the filter sections 10-20 is of the switched capacitor configuration shown in FIG. 2. The z transform function of this filter section is given by the expression:

$$H(Z) = -FA\frac{1 - Z^{-1}}{CFZ^{-2} + (BE - FD - 2CF)Z^{-1} + FD + CF} \quad (2)$$

In Equation (2) the constants A,B,C,D,E,F represent the values of the correspondingly designated capacitors in each of the switched capacitor filter sections. Thus, by properly selecting the value of the capacitors A-F in each of the filter sections of FIG. 2, the conjugate poles provided by each filter section can be established at the desired locations on the pole circle 1, as illustrated in FIG. 3. The design and manner of operation of the switched capacitor filter section is not per se novel and is described, for example, in U.S. Pat. No. 4,315,227 to which reference is made. No further description of that filter section is accordingly given in this specification.

In the operation of the filter of the invention, as exemplified in the embodiment of FIG. 1, the alternative conductivity of FETs Q2, Q4, and Q6 in response to the clock signal $\phi 2$, and of FETs Q5, Q3 and Q1 in response to clock signal $\phi 1$, and the relative weighting of the summing capacitors, C1, C2, and C3 cause the band-pass functions of the filter sections 10 to 20 to be summed by grouping equally weighted positive and negative "residue" terms of the band-pass functions by alternatively clocking the outputs of adjacent pairs of individual filter sections into a single summing capacitor at opposite clock phases. More specifically, the output functions of band-pass filter sections 20 and 18 and of filter sections 16 and 14 are applied during opposite clock signals $\phi2$ and $\phi1$, respectively, to summing capacitors C1 and C2, whereas the band-pass functions of filter sections 12 and 10, which contribute the corrector poles P1 and P6, are summed during opposite clock phases in capacitor C3, which has a value of capacitance of one-half that of capacitors C1 and C2 such that the corrector poles are summed with a magnitude of one half that of the main poles, as called for in Equation (1). During the clock signal $\phi2$, FET Q7 is conductive, thereby connecting the summed filter output functions on line 24 to the output circuit 26, whereas during the clock signal $\phi1$, FET Q8 is conductive, thereby to connect line 24 to ground. The output of the filter at the output 30 of amplifier P is the sampled and held value of the band-pass function summation, which is accomplished by the capacitors C4 and C5 in the sample and hold circuit 28. The values of capacitors C4 and C5 are preferably equal so that a charge from a previous cycle stored on capacitor C4 during the clock signal $\phi2$ when FET Q9 is conducting is "de-integrated" on capacitor C5 during the clock signal $\phi1$ when FET Q10 is conductive.

The selection of the pole locations in each filter section BPF is determined in large part by the desired frequency-response characteristics of the overall filter, that is, the center frequency and the upper and lower break points, which define the pass band of the filter. One filter fabricated in accordance with this invention had a passband center at 1 kHz with a passband at one octave defined by $-6$ db points. The six filter sections had poles located in the z plane at a radius of 0.990439 and angles of $\pm 8.807°$, $\pm 8.257°$, $\pm 7.156°$, $\pm 6.055°$, $\pm 4.954°$, and $\pm 4.404°$.

The band-pass filter of the present invention as described hereinabove thus provides several highly desirable characteristics which were not all previously attainable in prior art band-pass filters. The filter of the invention exhibits both linear phase in the pass band as well as sharp cut-off skirts in the stop band, and thus provides the optimum amplitude and phase response that is theoretically associated with Lerner-type filters. The filter of the invention has the additional advantage of being amenable to fabrication on a single semiconductor integrated circuit chip, such as one using a depletion-enhancement n-channel process in which the capacitors in the filter sections and summing circuits may be formed as a poly-gate oxide n+ implant structure. The filter of the invention has the further advantage of parallel architecture, which results in faster setting times as compared to many cascaded filter networks.

As noted, although the filter of the present invention has been described as containing six filter sections, filters employing either a greater or lesser number of filter sections may also be used depending on the desired filter characteristics. It will thus be appreciated that whereas the filter of the invention has been described with respect to a single embodiment thereof, modifications and variations may be made therein without necessarily departing from the spirit and scope of the invention.

What is claimed is:

1. A band-pass filter comprising an input terminal, a plurality of filter sections having predetermined transform functions and each having an input operatively connected to said input terminal, an output terminal, each of said plurality of filter sections comprising a switched capacitor filter including a plurality of switched capacitors, the values of the capacitances of said switched capacitances being selected so that each of said filter sections contributes one pair of conjugate poles to the overall filter transform function, and means operatively interposed between the outputs of said plurality of filter sections and said output terminal for selectively weighting and summing the outputs of said filter sections such that the active poles contributed by each of said filter sections are arranged on a circle concentric with and having a radius less than that of a unit circle of the z plane, said poles, with the exception of corrector poles, being equiangularly spaced from one another along said pole circle.

2. The band-pass filter of claim 1, in which said weighting and summing means comprises first and second switching means respectively connected to the outputs of each pair of said filter sections, and means, including a source of first and second oppositely phased control signals, for alternatively actuating said first and second switching means.

3. The band-pass filter of claim 2, in which said weighting and summing means further includes a plurality of summing capacitors respectively coupled through said first and second switching means to the outputs of each pair of said filter sections, the relative values of the capacitances of said summing capacitors being preselected to establish the desired weighting of the outputs of said filter sections.

4. The band-pass filter of claim 3, further comprising a summing line coupled to said summing capacitors, and third switching means interposed between said summing line and said output terminal and actuated by one of said control signals for operatively connecting the outputs of said filter sections to said output terminal upon the presence of said one of said control signals.

5. The band-pass filter of claim 4, further comprising an amplifier having an output connected to said output terminal and an input coupled to said third switching means, and a sample-and-hold circuit coupled across an input and the output of said amplifier.

6. The band-pass filter of claim 5, in which said sample-and-hold circuit includes fourth and fifth switching means alternatively actuated by said control signals, and charging means connected to said fourth and fifth switching means and alternately charged and discharged during the occurrence of said first and second control signals.

* * * * *